United States Patent [19]

Koide

[11] Patent Number: 5,148,050
[45] Date of Patent: Sep. 15, 1992

[54] VARIABLE FREQUENCY-DIVIDING CIRCUIT

[75] Inventor: Nobuo Koide, Tokyo, Japan

[73] Assignee: Kabushiki Kaisha Toshiba, Kawasaki, Japan

[21] Appl. No.: 747,710

[22] Filed: Aug. 20, 1991

[30] Foreign Application Priority Data

Aug. 23, 1990 [JP] Japan .................. 2-219936

[51] Int. Cl.⁵ .............................. H03L 7/00
[52] U.S. Cl. .................. 307/271; 307/272.7; 377/121
[58] Field of Search ............... 307/271, 279, 304, 571, 307/272.1, 272.2; 377/121; 363/157

[56] References Cited

U.S. PATENT DOCUMENTS

| | | | |
|---|---|---|---|
| 4,103,184 | 7/1978 | Suzukie et al. | 377/121 |
| 4,637,039 | 1/1987 | Huizer | 377/121 |
| 4,733,110 | 3/1988 | Hara | 307/446 |
| 4,902,909 | 2/1990 | Chantepie | 307/272.2 |

Primary Examiner—Steven L. Stephan
Assistant Examiner—Adolf Berhane
Attorney, Agent, or Firm—Finnegan, Henderson Farabow, Garrett and Dunner

[57] ABSTRACT

One output signal of a D flip-flop circuit FF2 is fed via a wiring W1 back to an input terminal of a D flip-flop circuit FF1, while one output signal of a D flip-flop circuit FF3 is fed via a wiring W2 back to another input terminal of the D flip-flop circuit FF1. One output signal of the D flip-flop circuit FF1 is supplied to an edge-trigger type flip-flop circuit FF4. A NAND circuit NA generates a reset signal in accordance with the output signal of the edge-trigger type flip-flop circuit FF4 and a frequency-dividing switching control signal which changes the frequency-dividing ratio, and sends the reset signal to the D flip-flop circuit FF3. These D flip-flop circuits FF1, FF2, FF3 and FF4 frequency-divide a clock signal by an odd number or an even number. The D flip-flop circuits FF1, FF2, FF3 and FF4 each comprise multiple NOR gates, which each include field-effect transistors. The current-driving performance of the field-effect transistors constituting the NOR gates to which feedback circuits, such as the wirings W1 and W2, are connected as a load, is set almost two to four times that of the field-effect transistors constituting those NOR gates where no feedback circuits are connected.

17 Claims, 7 Drawing Sheets

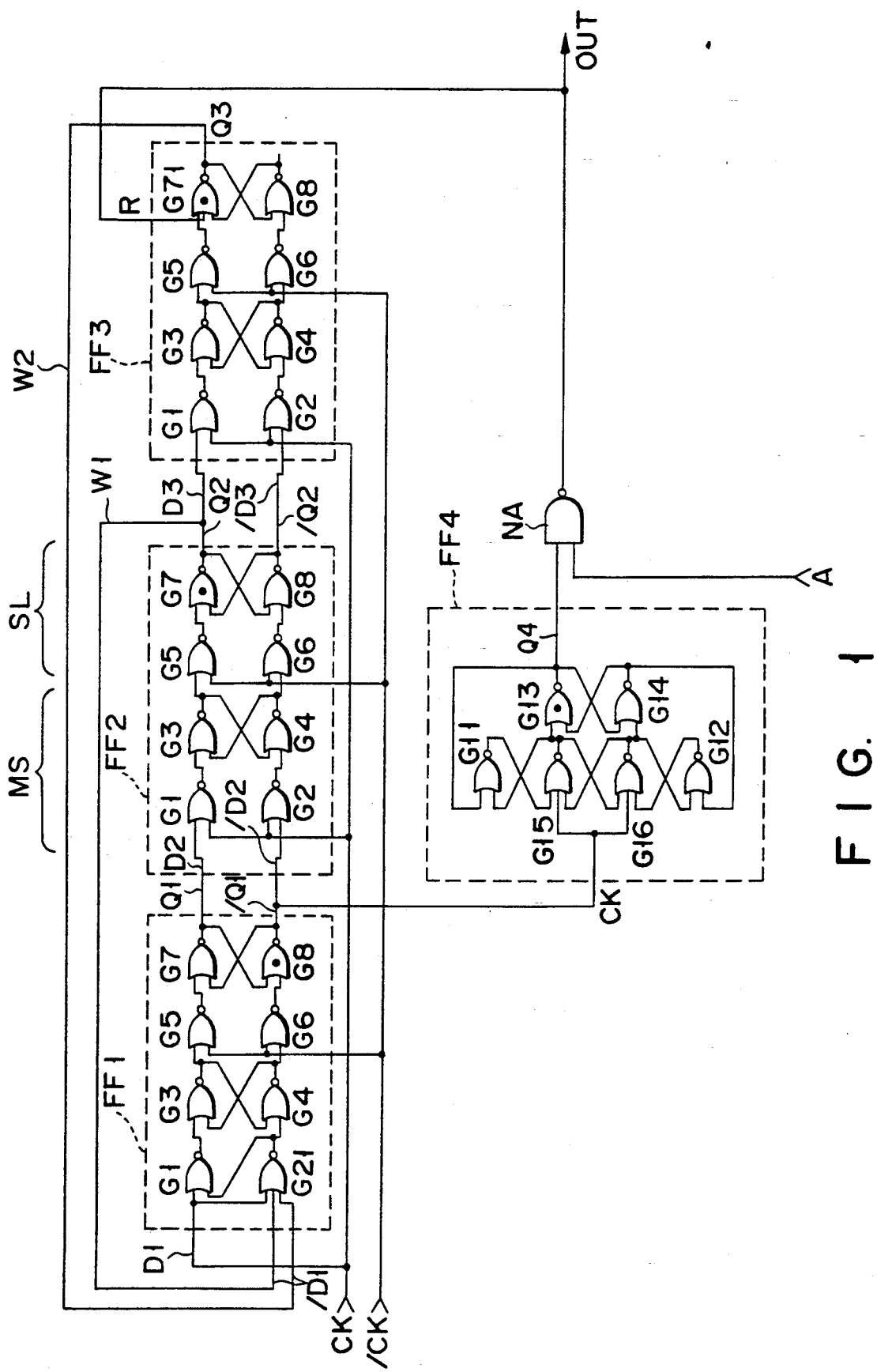
F I G. 1

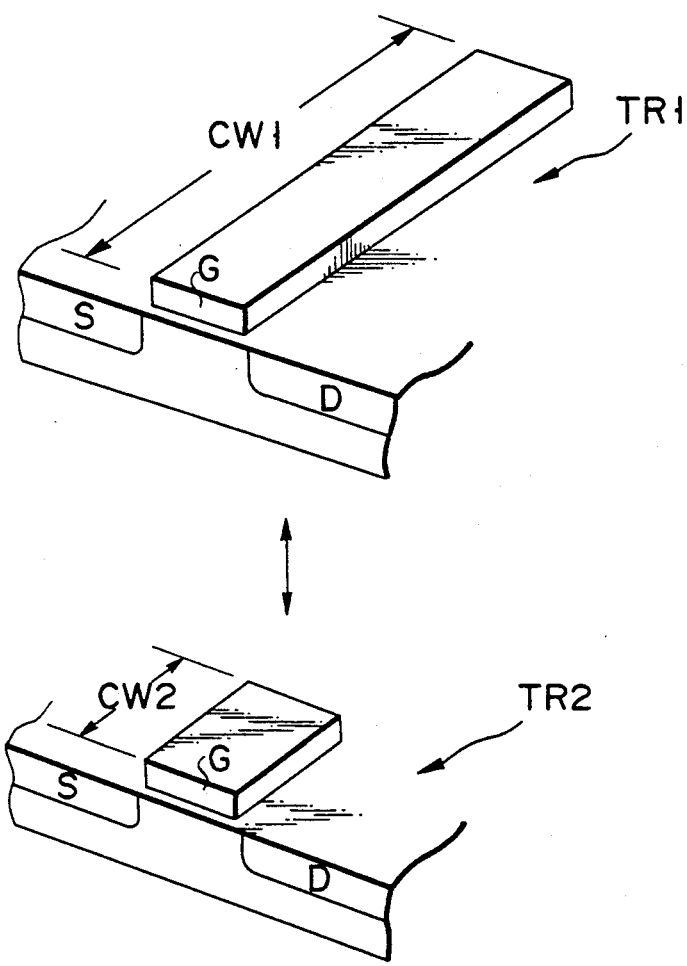
F I G. 2

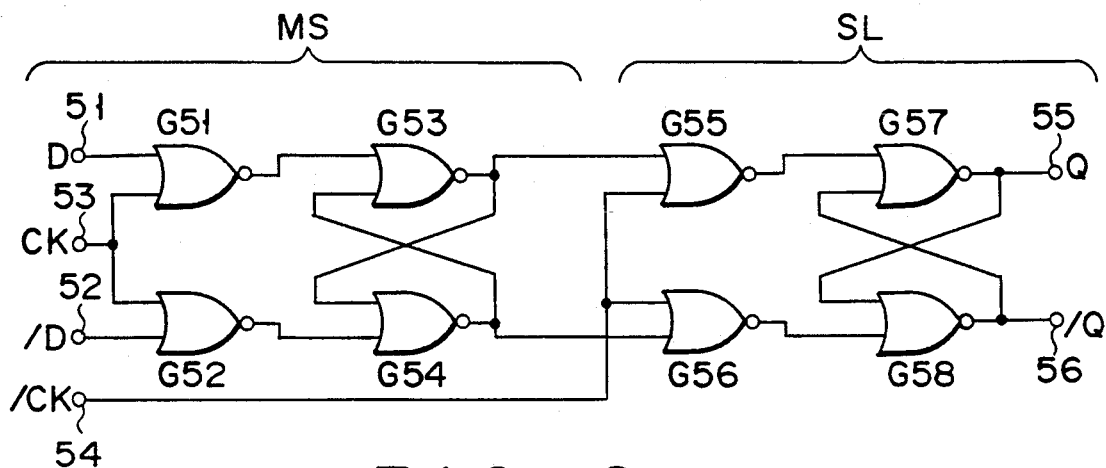
FIG. 6 PRIOR ART
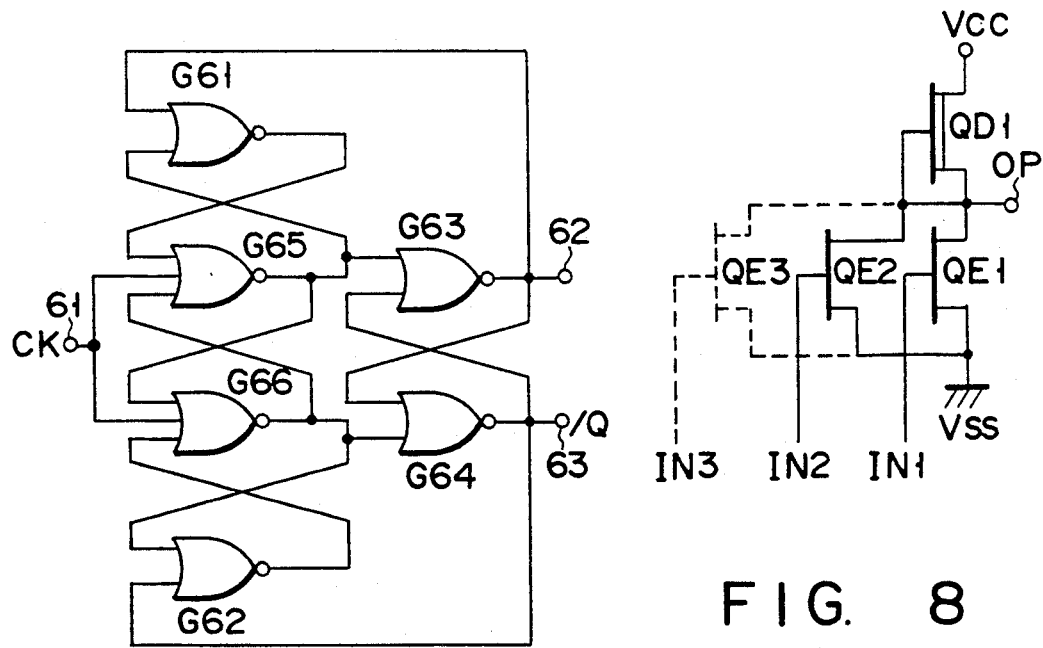
FIG. 7 PRIOR ART
FIG. 8 PRIOR ART

VARIABLE FREQUENCY-DIVIDING CIRCUIT

BACKGROUND OF THE INVENTION

1. Field of the Invention

The present invention relates to a variable frequency-dividing circuit, which comprises integrated semiconductor circuits, and can change the frequency-dividing ratio. More specifically, the present invention pertains to a variable frequency-dividing circuit operable at a high speed with low current consumption.

2. Description of the Related Art

FIG. 5 illustrates a conventional variable frequency-dividing circuit, which comprises multiple flip-flop circuits. These flip-flop circuits etch include metal Schottky field-effect transistors using GaAs (gallium-/arsenic), for example. The variable frequency-dividing circuit is designed to be capable of frequency-dividing a clock signal by eight or nine.

In FIG. 5, master-slave type D flip-flop circuits 41 to 43 each output a pair of complimentary input signals with a delay of one clock. The D flip-flop circuit 41 has its output terminals Q1 and /Q1 connected to the input terminals D2 and /D2 of the D flip-flop circuit 42, respectively. The D flip-flop circuit 42 has its output terminals Q2 and /Q2 connected respectively to input terminals D3 and /D3 of the D flip-flop circuit 43. The D flip-flop circuits 41 to 43 receive a pair of complementary clock signals, CK and /CK. The output terminal Q2 of the D flip-flop circuit 42 and the output terminal Q3 of the D flip-flop circuit 43 are connected respectively through feedback wirings W1 and W2 to the input terminals of an OR gate 45. The output terminal of the OR gate 45 is connected to the input terminal /D1 of the D flip-flop circuit 41.

The output terminal /Q1 of the flip-flop circuit 41 is connected to the clock-signal input terminal CK of an edge-trigger type flip-flop circuit 44. The edge-trigger type flip-flop circuit 44 frequency-divides a signal to be output from the D flip-flop circuit 41. This flip-flop circuit 44 has its output terminal Q4 connected to an output terminal OUT and also to one of the input terminals of a NAND circuit 46. A switching control signal A for switching the frequency-dividing period is sent to the other input terminal of the NAND circuit 46. The D flip-flop circuit 43 has its reset-signal input terminal R connected to the later output terminal of the NAND circuit 46.

FIG. 6 shows the D flip-flop circuits 41 and 42. The flip-flop circuits 41 and 42 each include a master stage MS and a slave stage SL. The master stage MS has four two-input NOR gates G51 to G54, input terminals 51 and 52 where complimentary input data D and D are to be sent, and an input terminal where the clock signal CK is to be sent. The slave stage SL has four two-input NOR gates G55 to G58, an input terminal 54 for the clock signal /CK, and output terminals 55 and 56 from which complimentary output data Q and /Q are to be sent.

The D flip-flop circuit 43 has a three-input NOR gate instead of the two-input NOR gate 57 in the slave stage SL as shown in FIG. 6. One input terminal of the three-input NOR gate is a reset input terminal R. When a "1"-level signal is supplied to the reset input terminal R, stored data is cleared and the output data Q is always set to "0".

FIG. 7 illustrates the edge-trigger type flip-flop circuit 44. The edge-trigger type flip-flop circuit 44 includes four two-input NOR gates G61 to G64, two three-input NOR gates G65 and G66, an input terminal 61 for the clock signal CK, and output terminals 62 and 63 for outputting complimentary signals, all connected as illustrated.

FIG. 8 shows the circuit arrangement of the two-input NOR gates G51 to G58 and G61 to G64. A depression type transistor QD1 as a load has a current path whose one end is connected to a supply potential $V_{cc}$, with the other end and the gate of the transistor connected to an output terminal OP. Between the output terminal OP and the ground potential $V_{ss}$ is connected enhancement type switching transistors QE1 and QE2 whose current paths are connected in parallel to each other. A logical input IN1 is supplied to the gate of the transistor QE1, while a logical input IN2 is sent to the gate of the transistor QE2.

The three-input NOR gates G65 and G66 each have an additional enhancement transistor QE3 connected in parallel to the transistors QE1 and QE2 shown in FIG. 8, as indicated by the broken lines in the same diagram. A logical input IN3 is supplied to the gate of the transistor QE3.

The operation of the variable frequency-dividing circuit in FIG. 5 will now be described referring to time charts in FIGS. 9 and 10.

First, the case of frequency-dividing a clock signal by eight will be explained referring to FIG. 9.

When the switching control signal A for changing the frequency-dividing ratio has a value of "0", a signal "1" is always input to the reset input terminal R, and accordingly a signal "0" is always output from the output terminal Q3 of the D flip-flop circuit 43. At this time, the D flip-flop circuit 43 does not work, while the D flip-flop circuits 41 and 42, and the edge-trigger type flip-flop circuit 44 operate. The D flip-flop circuit 41 and 42 are synchronously driven in response to the clock signals CK and /CK, with the output terminal Q2 o the D flip-flop circuit 42 connected to the input terminal /D1 of the D flip-flop circuit 41. These flip-flop circuits 41 and 42 therefore frequency-divide the clock signals by four. The frequency-divided signal is sent from the output terminal /Q1 of the D flip-flop circuit 41, and is frequency-divided by eight by the edge-trigger flip-flop circuit 44. The resultant frequency-divided signal is then output from the flip-flop circuit 44.

Second, the case of frequency-dividing the clock signal by nine will be explained referring to FIG. 10. When the switching control signal A has a level of "1", a signal from the output terminal Q4 of the edge-trigger flip-flop circuit 44 is inverted by the NAND circuit 46, and the inverted signal is sent to the reset input terminal R. When a signal "0" is output from the output terminal Q4 of the flip-flop circuit 44, a signal "1" is sent to the reset input terminal R, and the clock signal is to be frequency-divided by eight in the same manner as described above.

When the output signal from the output terminal Q4 of the edge-trigger type flip-flop circuit 44 has a level of "1", the signal "0" is sent to the reset input terminal R to operate the D flip-flop circuit 43. Since the flip-flop circuit 43 has its output terminal Q3 connected to the input terminal /D1 of the D flip-flop circuit 41 through the OR gates 45, the D flip-flop circuits 41 and 42 frequency-divide the clock signal by four and five, alternately. As a result, the edge-trigger type flip-flop circuit 44 outputs a signal frequency-divided by nine.

The operation speed of the variable frequency-dividing circuit is defined by the operation speed of the D flip-flop circuits 41 through 43, the capacitors of the wiring W1 and W2, and a delay in operation along the route from the D flip-flop circuit 41, to the edge-trigger flip-flop circuit 44, to the NAND gate 46 and to the D flip-flop circuit 43.

Particularly when the clock signal is frequency-divided by an odd number, the signal has to pass more gate circuits than when the signal is frequency-divided by an even number, so that the operation speed gets slower. Moreover, in general, the field-effect transistor is less capable of driving a current than a bipolar transistor. Since the above-described variable frequency-dividing circuit comprises the field-effect transistors, its operation speed drops further.

As a solution to this shortcoming, the current-driving performance of each gate may be improved. In this case, however, power consumption will undesirably rise in the variable frequency-dividing circuit.

SUMMARY OF THE INVENTION

It is therefore an object of the present invention to provide a variable frequency-dividing circuit, which restrains current consumption from increasing and can improve the operation speed.

To achieve the object of the present invention, a variable frequency-dividing circuit comprises a frequency-dividing circuit for frequency-dividing an input signal in response to a clock signal and outputting a frequency-divided signal, the frequency-dividing circuit including a first gate circuit for receiving the input signal and a second gate circuit for outputting the frequency-divided signal, each having multiple field-effect transistors; and feedback circuit means for feeding a signal from the second gate circuit back to the first gate circuit; the field-effect transistors constituting the second gate circuit having a current-driving performance set almost two to four times as great as that of the field-effect transistors constituting the first gate circuit, thereby making the current-driving performance of the field-effect transistors in the first gate circuit smaller.

According to the present invention, the gate circuit where the preferred embodiment of the feedback circuit means is connected as a load has its current-driving performance set two to four times higher than that of other gate circuit. Even with the great load of the gate circuit, a signal delay can be prevented. Further, the gate circuits, other than the gate circuit to be connected to the feedback circuit means has its current-driving performance set lower. Even though the current driving performance of that gate circuit which is to be connected to the feedback circuit means is increased, therefore, it is still possible to restrain an increase in the total current consumption in the variable frequency-dividing circuit.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a circuit diagram illustrating one embodiment of the present invention;

FIG. 2 is a perspective view showing the structure of a transistor to be used in the circuit shown in FIG. 1;

FIG. 6 is a circuit diagram showing a D flip-flop circuit shown in FIG. 5;

FIG. 7 is a circuit diagram illustrating an edge-trigger type flip-flop circuit shown in FIG. 5;

FIG. 8 is a circuit diagram of a NOR gate circuits shown in FIGS. 6 and 7; and

DETAILED DESCRIPTION OF THE PREFERRED EMBODIMENTS

Figure 3:
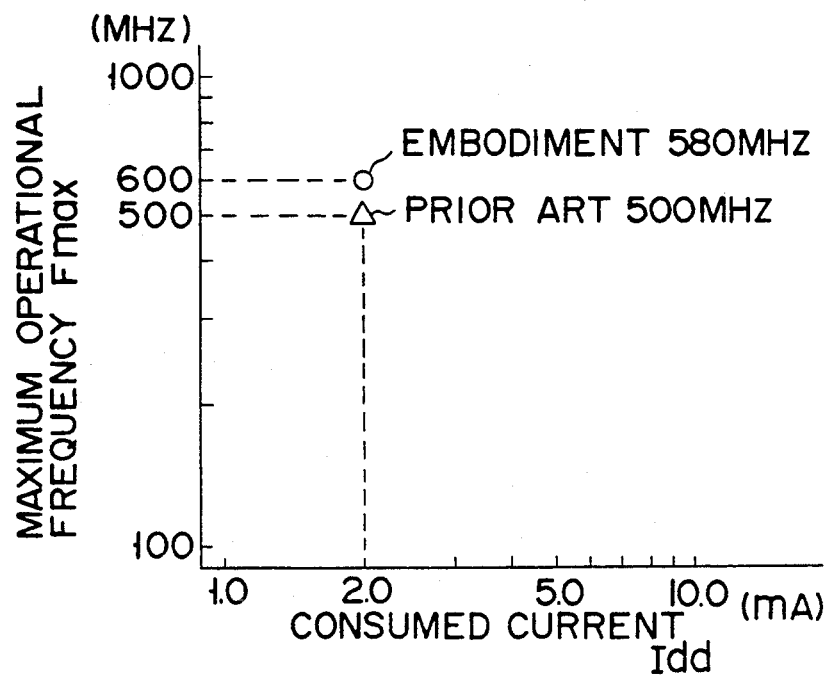
FIG. 3 is a characteristic diagram showing the relationship between the consumed current and the maximum operational frequency in a variable frequency-dividing circuit embodying to the present invention.

A preferred embodiment of the present invention will now be described referring to the accompanying drawings.

FIG. 1 shows a variable frequency-dividing circuit able to frequency-divide a clock signal by eight or nine. Master-slave D flip-flop circuits FF1 to FF3 each output a pair of complimentary input signals with a delay of one clock. The D flip-flop circuit FF1 has its output terminals Q1 and /Q1 connected to the input terminals D2 and /D2 of the D flip-flop circuit FF2, respectively. The D flip-flop circuit FF2 has its output terminals Q2 and /Q2 connected respectively to input terminals D3 and /D3 of the D flip-flop circuit FF3. The D flip-flop circuits FF1 to FF3 receive a pair of complementary clock signals, CK and /CK. The output terminal Q2 of the D flip-flop circuit FF2 and the output terminal Q3 of the D flip-flop circuit FF3 are connected respectively through feedback wirings W1 and W2 to the input terminal /D1 of the D flip-flop circuit FF1.

The output terminal /Q1 of the flip-flop circuit FF1 is connected to the clock-signal input terminal CK of an edge-trigger type flip-flop circuit FF4. The edge-trigger type flip-flop circuit FF4 frequency-divides a signal to be output from the D flip-flop circuit FF1. This flip-flop circuit FF4 has its output terminal Q4 connected to one of the input terminals of a NAND circuit NA. A switching control signal A for switching the frequency-dividing period is sent to the other input terminal of the NAND circuit NA. The output terminal of the NAND circuit NA is connected to an output terminal OUT and also to a reset-signal input terminal R of the D flip-flop circuit FF3.

The flip-flop circuits FF1 to FF3 each include the master stage MS and the slave stage SL. In the D flip-flop circuit FF2, the master stage MS has FF2 has four two-input NOR gates G1 to G4, and the slave stage SL has four two-input NOR gates G5 to G8.

The D flip-flop circuit FF3 has a three-input NOR gate G71 instead of the two-input NOR gate G7 in the slave stage SL in the D flip-flop circuit FF2. One input terminal of the three-input NOR gate G71 is the reset input terminal R. When a "1"-level signal is supplied to the reset input terminal R, the output signal Q3 is always set to "0".

The D flip-flop circuit FF1 has a three-input NOR gate G21 instead of the two-input NOR gate G2 in the master stage MS in the D flip-flop circuit FF2. The feedback wirings W1 and W2 are connected to the two input terminals of the three-input NOR gate G21.

The edge-trigger type flip-flop circuit FF4 includes four two-input NOR gates G11 to G14 and two three-input NOR gates G15 and G16 all connected as illustrated.

The two-input NOR gates G1 to G8 and G11 to G14 and the three-input NOR gates G21, G71, G15 and G16 have the same structures as the circuits shown in FIG. 8. These gates include metal Schottky field-effect transistors using GaAs (gallium/arsenic), for example.

The NOR gates G7 and G71 in the respective circuits FF2 and FF3, the NOR gate G8 in the circuit FF1, and the NOR gate G13 in the circuit FF4 have a higher current-driving performance than the other gates; the NOR gates G7 and G71 have their output terminals connected to the wirings W1 and W2, the NOR gate G8 has its output terminal connected to the edge-trigger type flip-flop circuit FF4, and the NOR gate G13 has its output terminal connected to the NAND gate NA. These NOR gates G8, G7, G71 and G13 are each marked by a dot put in the symbol of a NOR gate.

FIG. 2 shows a transistor TR1 as a component of the NOR gates G8, G7, G71 and G13, and a transistor TR2 as a constituent of other NOR gates. In this case, the channel width CW1 of the transistor TR1 is set nearly three times the channel width CW2 of the transistor TR2, thereby increasing the current-driving performance of the transistor TR1. It is proper to set the channel width of the transistor to two to four times wider. The channel width of the transistor TR2 is set narrower than that of the transistors constituting the conventional gate circuit shown in FIGS. 6 to 8. The transistor TR2 therefore has a smaller current-driving performance. For example, the channel width CW2 of the transistor TR2 is determined as ⅓ of the conventional transistor's channel width.

As described above, as the transistors TR1 constituting the NOR gates G8, G7, G71 and G13 are designed to have greater current-driving performance, the transistors TR2 constituting other gate circuits are designed to have smaller current-driving performance, accordingly. The D flip-flop circuits FF1 to FF3 therefore consume the same amount of current as those of the prior art.

Figure 9:
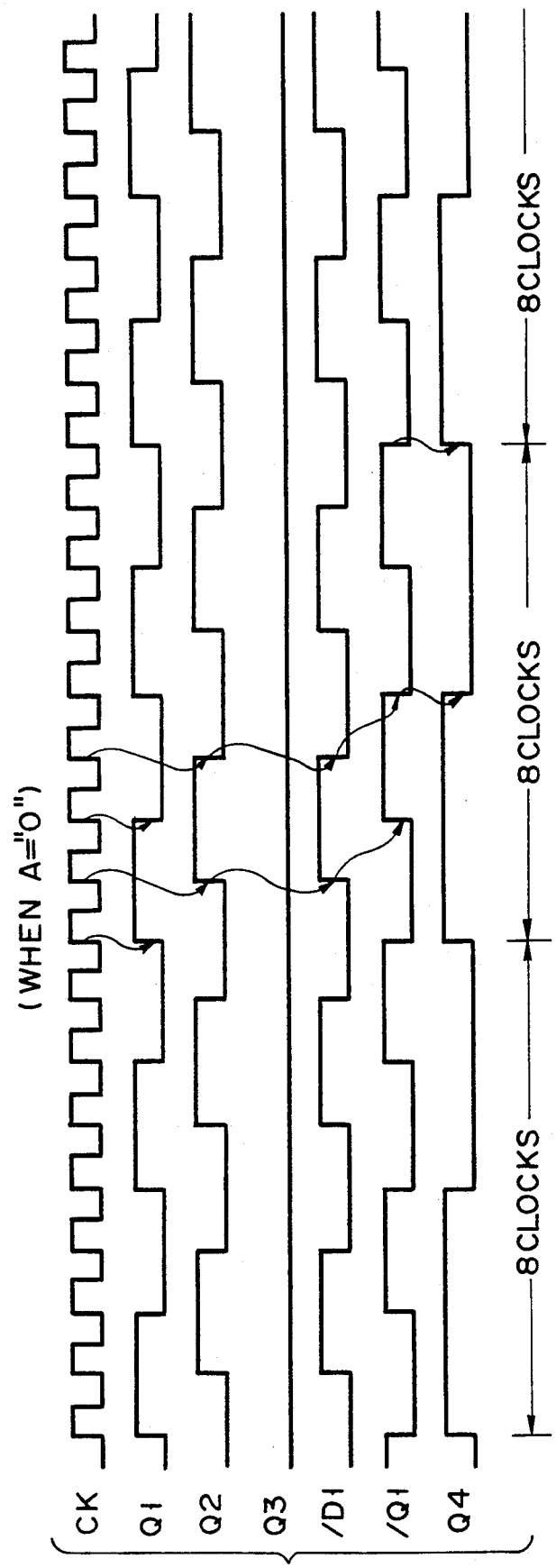
FIGS. 9 and 10 present timing charts for explaining the operation of the circuit shown in FIG. 5.
Figure 10:
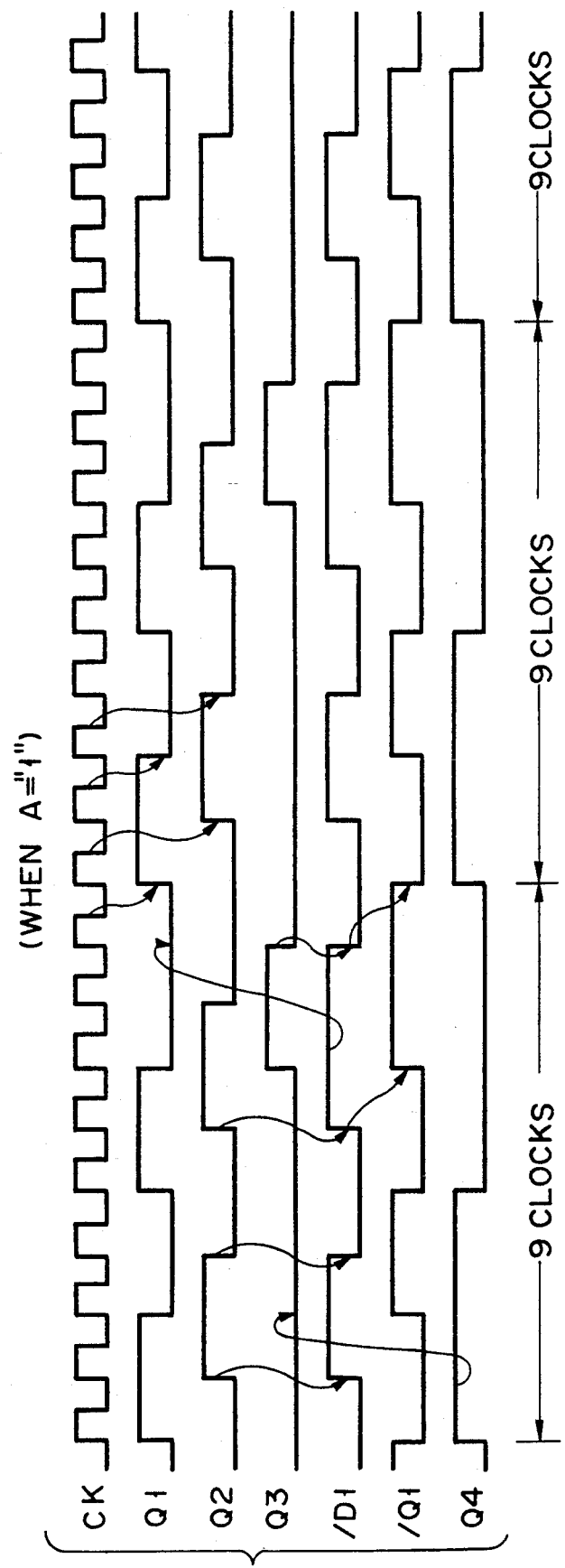

Basically, the variable frequency-dividing circuit shown in FIG. 1 is operated according to the timing charts shown in FIGS. 9 and 10. The current-driving performance of the NOR gates G8, G7, G71 and G13 is three times that of other NOR gates. Even though greater loads are connected to the NOR gates G8, G7, G71 and G13, therefore, the waveforms of the signals at these gates sharply rise and drop. This can ensure a high-speed operation.

FIG. 3 shows the maximum operational frequency $F_{max}$ when the current $I_{dd}$ consumed in the variable frequency-dividing circuit of the present invention is constant, for example, 2 mA. The maximum operational frequency $F_{max}$ in this embodiment is 580 MHz, while $F_{max}$ in the conventional case is 500 MHz. The maximum operational frequency is increased by about 16% in this embodiment, compared with the conventional case.

Figure 4:
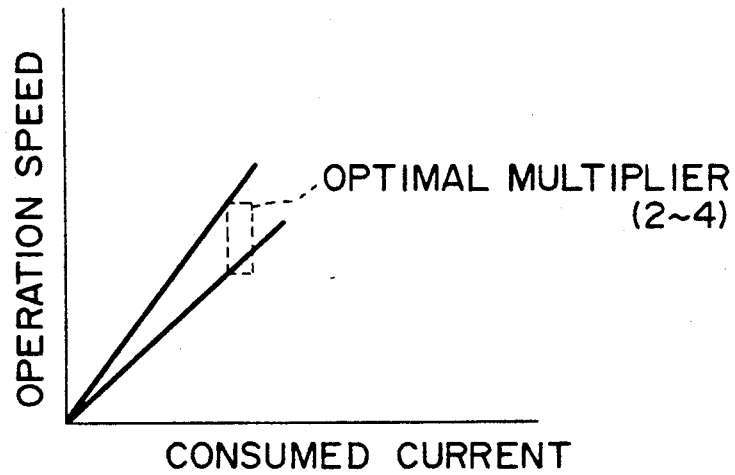
FIG. 4 is a diagram illustrating the relationship between the consumed current and the operation speed of the variable frequency-dividing circuit according to the present invention.
Figure 5:
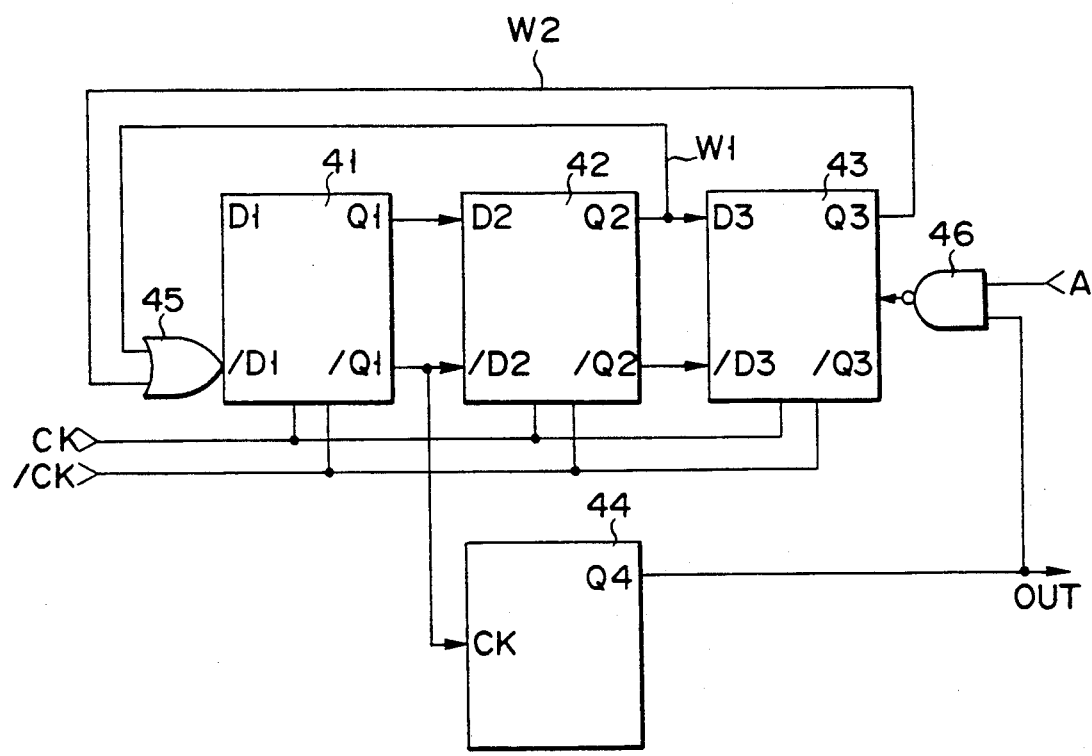
FIG. 5 is a circuit diagram illustrating a conventional variable frequency-dividing circuit.

FIG. 4 expresses the relation between the consumed current and the operation speed of the variable frequency-dividing circuit in this invention. The gate circuit, to which the feedback wirings and circuits are connected as a load, has its current-driving performance determined by the mutual relationship between the current consumption and the operation speed (maximum operational frequency) of the variable frequency-dividing circuit. In other words, the range indicated by the broken line in FIG. 4 is the optimal range, and the optimal multiplication factor for the current-driving performance is two to four times in this case. The multiplier is not however limited to an integer. Suppose that the gate circuit to which the feedback wirings and circuits are connected as a load has its current-driving performance four times that of the other gate circuits. The load on the gate circuit arranged at the preceding stage to the gate circuit where the feedback wirings, etc. are connected as a load. This reduces the operation speed.

Regarding the transistors TR2 constituting the gate circuits other than the NOR gates G8, G7, G71 and G13, it is not necessary to design the transistors to have the same size. The size may be altered according to the load connected to each gate to determine the current-driving performance of that gate.

Even with the channel width CW2 of the transistor TR2 set equal to that of the conventional transistor, it is possible to prevent the current consumption of the entire circuit from significantly increasing.

While the metal Schottky field-effect transistor of GaAs is used in the above embodiment, it is not limited to this particular type, and a MOS-type field-effect transistor may be used as well.

Further, the present invention may be variously modified without departing from the scope and spirit of the invention.

What is claimed is:

1. A variable frequency-dividing circuit comprising:
   a first flip-flop circuit for sequentially generating input signals in response to a clock signal, said first flip-flop circuit including first and second gate circuits responsive to said input signals and third and fourth gate circuits for generating signals from said first and second gate circuits as opposite signals in response to a clock signal, said first to fourth gate circuits each having field-effect transistors;
   a second flip-flop circuit including fifth and sixth gate circuits responsive to said opposite signals, and seventh and eighth gate circuits for generating signals from said fifth and sixth gate circuits in response to a clock signal, said fifth to eighth gate circuits each having field-effect transistors;
   a third flip-flop circuit including ninth and tenth gate circuits responsive to opposite signals from said seventh and eighth gate circuits, and eleventh and twelfth gate circuits for generating signals from said ninth and tenth gate circuits in response to a clock signal, said ninth to twelfth gate circuits each having field-effect transistors;
   first means for feeding a signal from said seventh gate circuit to said second gate circuit;
   second means for feeding a signal from said eleventh gate circuit to said second gate circuit;
   a fourth flip-flop circuit including a thirteenth gate circuit responsive to a signal from said fourth gate circuit, and a fourteenth gate circuit for frequency-dividing a signal from said thirteenth gate circuit and generating said frequency-divided signal, said thirteenth and fourteenth gate circuits each having field-effect transistors; and third means for generating a reset signal in accordance with said signal from said fourteenth gate circuit and a signal for changing a frequency-dividing ratio, and supplying said reset signal to said eleventh gate circuit, wherein field-effect transistors constituting said fourth, seventh, eleventh and fourteenth gate circuits have wider channel widths than channel widths of said field-effect transistors constituting said first, second, third, fifth, sixth, eighth, ninth, tenth, twelfth and thirteenth gate circuits, and said field-effect transistors constituting said fourth, seventh, eleventh and fourteenth gate circuits have a current-driving performance two to four times that of said field-effect transistors constituting said first, second, third, fifth, sixth, eighth, ninth, tenth, twelfth and thirteenth gate circuits.

2. A circuit according to claim 1, wherein said field-effect transistors constituting said fourth, seventh, eleventh and fourteenth gate circuits have a current-driving performance three times that of said field-effect transistors constituting said first, second, third, fifth, sixth, eighth, ninth, tenth, twelfth and thirteenth gate circuits.

3. A circuit according to claim 1, wherein said field-effect transistors constituting said fourth, seventh, eleventh and fourteenth gate circuits have a channel width three times that of said field-effect transistors constituting said first, second, third, fifth, sixth, eighth, ninth, tenth, twelfth and thirteenth gate circuits.

4. A circuit according to claim 1, wherein said first to third flip-flop circuits each comprise a master-slave type D flip-flop circuit.

5. A circuit according to claim 1, wherein said fourth flip-flop circuit comprises an edge-trigger type flip-flop circuit.

6. A circuit according to claim 1, wherein said first and second means are each constituted of a wiring.

7. A variable frequency-dividing circuit comprising:
a frequency-dividing circuit for frequency-dividing an input signal according to a clock signal and for generating a frequency-divided signal, said frequency-dividing circuit including a first gate circuit responsive to said input signal, the first gate circuit including an output stage having a field effect transistor having a first channel width and a first current-driving performance, and a second gate circuit for generating said frequency-divided signal, the second gate circuit including an output stage having a field effect transistor having a second channel width greater than the first channel width and a second current-driving performance two to four times greater than the first current-driving performance; and
feedback circuit means for feeding a signal from said second gate circuit to said first gate circuit.

8. A circuit according to claim 7, wherein said second current-driving performance is three times greater than said first current-driving performance.

9. A circuit according to claim 7, wherein said second channel width is three times greater than said first channel width.

10. A circuit according to claim 7, wherein said circuit means is constituted of a wiring.

11. A circuit according to claim 7, wherein said second gate circuit includes a plurality of metal schottky field-effect transistor having GaAs.

12. A circuit according to claim 11, wherein said first gate circuit includes a plurality of metal schottky field-effect transistor having GaAs.

13. A variable frequency-dividing circuit comprising:
a first flip-flop circuit, responsive to a data signal and to a clock signal, including
a first gate circuit for generating a first signal, the first gate circuit including an output stage having a field effect transistor having a first channel width, and a second gate circuit for generating a second signal, the second gate circuit including an output stage having a field effect transistor having a second channel width greater than the first channel width; and
a second flip-flop circuit, responsive to the first signal and to the second signal, including
a third gate circuit for generating a third signal, the third gate circuit including an output stage having a field effect transistor having a third channel width and a fourth gate circuit for generating the data signal, the fourth gate circuit including an output stage having a field effect transistor having a fourth channel width greater than the third channel width.

14. A circuit according to claim 13, wherein said first and second flip-flop circuits each comprise a master-slave type D flip-flop circuit.

15. A circuit according to claim 13, further including an edge-trigger type flip-flop circuit responsive to the second signal.

16. A circuit according to claim 13, wherein the second channel width is three times greater than the first channel width.

17. A circuit according to claim 13, wherein the fourth channel width is three times greater than the third channel width.

* * * * *